United States Patent [19]

Mapleston

[11] Patent Number: 4,870,416
[45] Date of Patent: Sep. 26, 1989

[54] ANALOGUE TO DIGITAL CONVERTERS

[75] Inventor: David B. Mapleston, Wiltshire, England

[73] Assignee: Plessey Overseas Limited, Ilford, England

[21] Appl. No.: 146,748

[22] PCT Filed: May 15, 1987

[86] PCT No.: PCT/GB87/00337
§ 371 Date: Feb. 18, 1988
§ 102(e) Date: Feb. 18, 1988

[87] PCT Pub. No.: WO87/07098
PCT Pub. Date: Nov. 19, 1987

[30] Foreign Application Priority Data

May 16, 1986 [GB] United Kingdom ............... 8611968

[51] Int. Cl.$^4$ ............................................. H03M 1/00
[52] U.S. Cl. ..................................... 341/110; 341/159; 341/156
[58] Field of Search ............... 341/141, 156, 118, 127, 341/122, 159, 110; 330/257

[56] References Cited

U.S. PATENT DOCUMENTS

| 3,891,984 | 6/1975 | Kerwin et al. | 341/156 |
| 4,686,511 | 8/1987 | Koen | 341/118 |
| 4,733,217 | 3/1988 | Dingwall | 341/122 |

Primary Examiner—William M. Shoop, Jr.
Assistant Examiner—Helen Kim
Attorney, Agent, or Firm—Fleit, Jacobson, Cohn, Price, Holman & Stern

[57] ABSTRACT

A subranging analogue to digital converter comprising a first analogue to digital converter for receiving an analogue input signal to be converted, a digital to analogue converter the input of which is coupled in series to the output of the first analogue to digital converter and a second analogue to digital converter the input of which is coupled in series to the output of the digital to analogue converter. The improvement lies in the provision of a circuit arrangement, in parallel with the first analogue to digital converter and the digital to analogue converter, for inverting the analogue input signal to provide an inverted analogue signal and summing means for combining the inverted analogue signal with the output signal from the digital to analogue converter to provide an input signal for the second analogue to digital converter.

5 Claims, 1 Drawing Sheet

U.S. Patent    Sep. 26, 1989    4,870,416
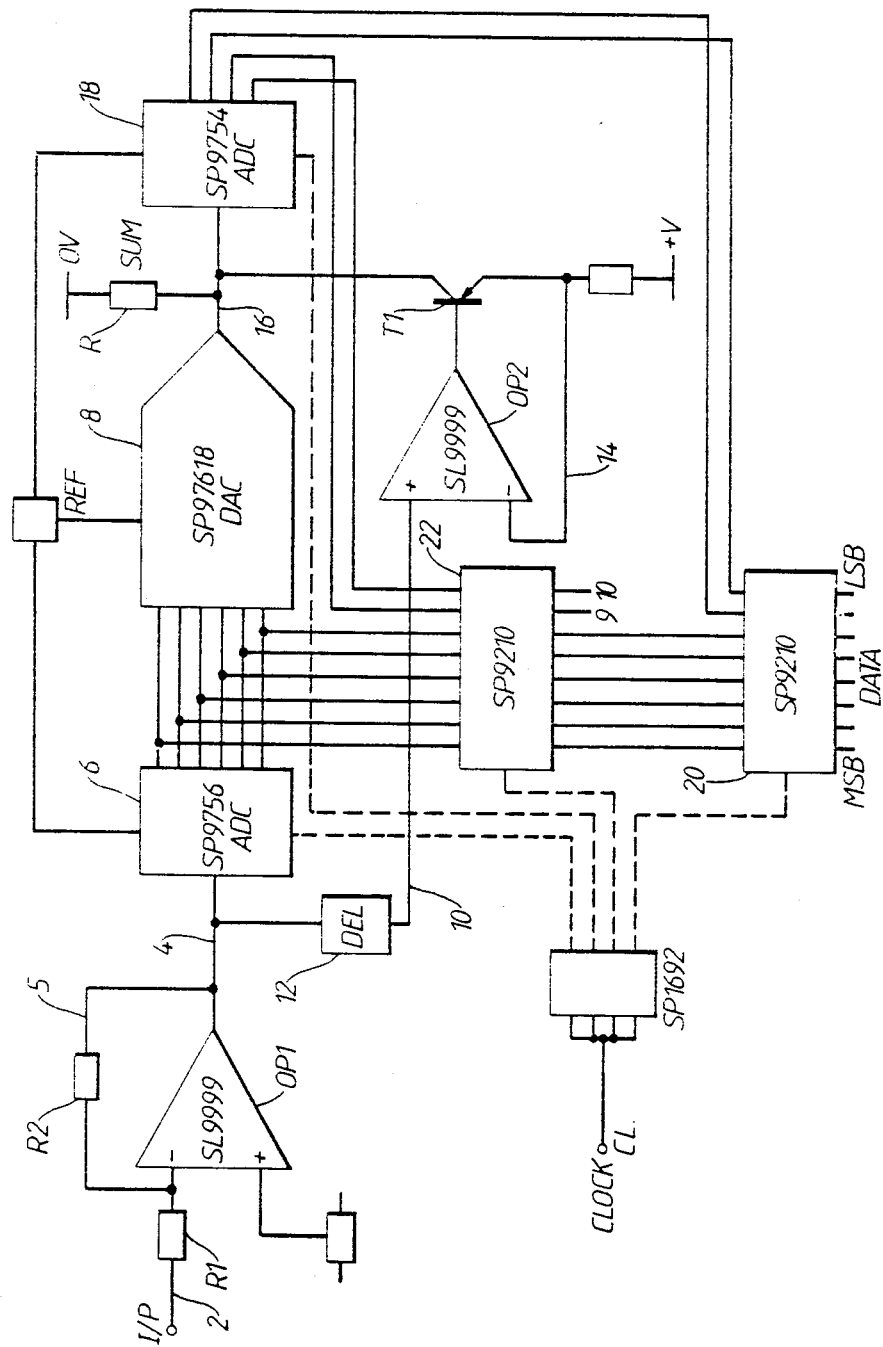

ANALOGUE TO DIGITAL CONVERTERS

BACKGROUND TO INVENTION

The present invention relates to subranging analogue to digital converters.

A known subranging analogue to digital converter comprises a first analogue to digital converter for receiving an analogue input signal to be converted, connected in series to a digital to analogue converter the output of which is connected in series via an operational amplifier to the input of a second analogue to digital converter. One of the inputs of the operational amplifier is connected to the output of the digital to analogue converter and a second input of the operational amplifier is connected via a delay line to the input of the first analogue to digital converter. In operation, the operational amplifier subtracts the analogue input signal from the output of the digital to analogue converter to provide an "error" signal which is transmitted to the input of the second analogue to digital converter. At least a part of the digital output from the second analogue to digital converter is combined with the digital output from the first analogue to digital converter to provide the digital output signal of the subranging analogue to digital converter.

The speed and accuracy of convertion of the analogue input signal to the digital output signal in the above described subranging circuit is adversely affected by signal propagation delays within the digital to analogue converter and within the series connected operational amplifier. These two propagation delays act as a constraint on the frequency of operation and performance of the subranging circuit.

SUMMARY OF INVENTION

An objective of the present invention is to improve the frequency of operation and the performance of subranging analogue to digital converters.

According to the present invention there is provided a subranging analogue to digital converter comprising a first analogue to digital converter for receiving an analogue input signal to be converted, a digital to analogue converter the input of which is coupled in series to the output of the first analogue to digital converter, a second analogue to digital converter the input of which is coupled in series to the output of the digital to analogue converter wherein the improvement lies in the provision of a circuit arrangement, in parallel with the digital to analogue converter and the first analogue to digital converter, for inverting the analogue input signal to provide an inverted analogue signal and summing means for combining the inverted analogue signal with the output signal from the digital to analogue converter to provide an input signal for the second analogue to digital converter.

A fundamental principle is that of replacing the operation of subtraction in the known subranging circuits by two operations, inversion and addition in such a way that the inversion operation time delay is effected in parallel with the digital to analogue time delay whereby the time delay caused by subtraction is eliminated thereby greatly improving the performance of the subranging analogue to digital converter.

In a preferred embodiment of the present invention the circuit arrangement, in parallel with the digital to analogue converter, comprises an operational amplifier an input of which is coupled via a delay line to the input of the first analogue to digital converter, the output of the operational amplifier being coupled via a transistor to the output of the digital to analogue converter, the operational amplifier and the transistor serving in operation to provide the inverted analogue signal, by inverting the analogue input signal to be converted and effecting a voltage to current conversion.

In one embodiment the transistor is of p-n-p type from the collector of which is transmitted in operation the inverted analogue signal.

In the one embodiment in which the transistor is of p-n-p type the collector is coupled to the output of the digital to analogue converter, the base of the transistor is coupled to the output of the operational amplifier and the emitter of the transistor is coupled via a feedback line to the inverting input of the operational amplifier, the non-inverting input of the operational amplifier being coupled via the delay line to the input of the first analogue to digital converter.

In a preferred embodiment the summing means comprises a resistor coupled to receive both the output current of the digital to analogue converter and the collector current of the transistor whereby in operation both currents are summed within the resistor to provide a voltage thereacross for applying to the input of the second analogue to digital converter.

BRIEF DESCRIPTION OF DRAWING

An embodiment of the present invention will now be described with reference to the accompanying block circuit diagram of a subranging analogue to digital converter.

SPECIFIC DESCRIPTION OF DRAWINGS

In operation an input signal is fed from an input terminal I/P along a line 2 and a resistor R1 to the inverting input of an operational amplifier OP1. Negative feedback is provided along a line 5 via a resistor R2. The output of OP1 provides an analogue input signal along a line 4 to the input of a first analogue to digital converter 6. In this embodiment the converter 6 is in the form of a six bit flash type ADC the digital output of which is fed to the input of a high performance digital to analogue converter 8 which has an open collector current output.

The analogue input signal on line 4 is also fed along a delay line 10, the time delay being represented by block 12, to the non-inverting input of an operational amplifier OP2. The output of OP2 is fed to the base of a p-n-p transistor T1 the emitter of which is coupled to the inverting input of OP2 along a line 14. OP2 and the transistor T1 together serve to invert the analogue input signal and carry out a voltage to current conversion so as to provide an anti-phase current from the collector of the transistor T1. The anti-phase current is fed together with the output current from the digital to analogue converter 8 through a summing resistor R sum which is connected between a line 16 and earth. The voltage developed across the summing resistor R sum is presented to the input of a second analogue to digital converter 18. In the embodiment the converter 18 is a high accuracy four bit ADC, such as the Plessey SP9754, which is desirable to use in view of the low voltage developed on the line 16.

As can be seen from the block diagram the six bit output of the first analogue to digital converter 6 is combined via a latching circuit 20 with two bits from the four bit output of the second analogue to digital converter 8 to provide an eight bit data output signal. The other two bits from the four bit output of converter 8 are lost in a latching circuit 22.

In the embodiment described above both OP2 and T1 are in parallel with the digital to analogue converter 8 and the first rank analogue to digital converter 6. In this parallel arrangement the OP2 propagation delay and settling time does not cause any detrimental effect to the subranging analogue to digital converters' speed.

Although the present invention has been described above with reference to a particular embodiment, it should be understood that modifications may be effected within the scope of the invention. Furthermore, it should be understood that the invention is applicable to both pipelined, sample and hold or track and hold subranging systems.

I claim:

1. A subranging analogue to digital converter comprising:
   (i) a first analogue to digital converter for receiving an analogue input signal for conversion, said first analogue to digital converter having an output;
   (ii) a digital to analogue converter, said digital to analogue converter having an input and an output, said input being arranged to be coupled in series to said output of said first analogue to digital converter;
   (iii) a second analogue to digital converter, said second analogue to digital converter having an input and an output, said input being arranged to be coupled in series to said output of said digital to analogue converter;
   (iv) inverter means for inverting an analogue input signal arranged to be received by said first analogue to digital converter, said inverter means being arranged to be coupled in parallel with said digital to analogue converter and said first analogue to digital converter, said inverter means being further arranged to provide an inverter analogue signal; and
   (v) summing means for instantaneously summing said inverted analogue signal and said output of said digital to analogue converter, said summing means being arranged to provide an input signal, said input signal being arranged to be coupled to said second analogue to digital converter.

2. A subranging analogue to digital converter as claimed in claim 1 wherein said inverter means comprises an operational amplifier an input of which is coupled via a delay line to the input of the first analogue to digital converter, the output of the operational amplifier being coupled via a transistor to the output of the digital to analogue converter, the operational amplifier and the transistor serving in operation to provide the inverted analogue signal by inverting the analogue input signal to be converted and effecting a voltage to current conversion.

3. A subranging analogue to digital converter as claimed in claim 2 wherein the transistor in a p-n-p transistor from the collector of which is transmitted in operation the inverted analogue signal.

4. A subranging analogue to digital converter as claimed in claim 3 wherein the collector of the transistor is coupled to the output of the digital to analogue converter, the base of the transistor is coupled to the output of the operational amplifier and the emitter of the transistor is coupled via a feedback line to the inverting input of the operational amplifier, the non-inverting input of the operational amplifier being coupled via the delay line to the input of the first analogue to digital converter.

5. A subranging analogue to digital converter as claimed in claim 2 wherein the summing means comprises a resistor coupled to receive both the output current from the digital to analogue converter and the collector current from the transistor where in operation both currents are summed within the resistor to provide a voltage across the resistor for applying to the input of the second analogue to digital converter.

* * * * *